(12) United States Patent
Schumacher

(10) Patent No.: US 8,554,500 B2
(45) Date of Patent: Oct. 8, 2013

(54) SYSTEM AND METHOD FOR GROUND ISOLATION DETECTION IN A VEHICLE

(75) Inventor: Ryan W. Schumacher, Fargo, ND (US)

(73) Assignee: Deere & Company, Moline, IL (US)

( * ) Notice: Subject to any disclaimer, the term of this patent is extended or adjusted under 35 U.S.C. 154(b) by 510 days.

(21) Appl. No.: 12/949,916

(22) Filed: Nov. 19, 2010

(65) Prior Publication Data

US 2011/0307196 A1     Dec. 15, 2011

Related U.S. Application Data

(60) Provisional application No. 61/353,710, filed on Jun. 11, 2010.

(51) Int. Cl.
  *G01R 31/00*     (2006.01)
  *G06F 11/30*     (2006.01)

(52) U.S. Cl.
  USPC .............. 702/58; 702/182; 702/183; 702/188

(58) Field of Classification Search
  USPC ........ 702/58–60, 64, 65, 75, 81, 82, 182–188
  See application file for complete search history.

(56) References Cited

U.S. PATENT DOCUMENTS

| | | | |
|---|---|---|---|
| 6,700,400 B2 | 3/2004 | Atarashi | |
| 6,822,839 B2 | 11/2004 | Habetler | |
| 7,336,455 B2 | 2/2008 | Dimino et al. | |
| 7,346,475 B2 | 3/2008 | Dimino et al. | |
| 7,539,549 B1 | 5/2009 | Discenzo et al. | |
| 2003/0067277 A1 | 4/2003 | Parlos et al. | |
| 2008/0030199 A1 | 2/2008 | Hou | |
| 2009/0051364 A1 | 2/2009 | Ishida et al. | |
| 2009/0085574 A1 | 4/2009 | Pan et al. | |
| 2009/0179663 A1 | 7/2009 | Hobelsberger | |
| 2009/0222142 A1 | 9/2009 | Kao et al. | |
| 2009/0323233 A1* | 12/2009 | Shoemaker et al. | 361/42 |
| 2010/0231284 A1* | 9/2010 | Jacobson et al. | 327/307 |

* cited by examiner

*Primary Examiner* — Phuong Huynh

(57) ABSTRACT

A first amplifier is arranged to receive a first signal from a first bus terminal. A second amplifier is configured to receive a second signal from a second bus terminal. An inverter input of an inverter is coupled to the output of the first amplifier. An input or inputs of an analog-to-digital converter are coupled to an inverter output of the inverter and the output of the second amplifier. The analog-to-digital converter is capable of producing a digital signal representative of the signals received from the first bus terminal and the second bus terminal. A data processor is capable of receiving an output of the analog-to-digital converter. The data processor is configured to apply one or more frequency domain transforms to the digital signal. The data processor identifies a circuit location of the ground fault or degraded isolation, a type of ground fault, or both based on the application of the frequency domain transform.

21 Claims, 4 Drawing Sheets

SYSTEM AND METHOD FOR GROUND ISOLATION DETECTION IN A VEHICLE

CROSS REFERENCE TO RELATED-APPLICATION

This document (including the drawings) claims priority based on U.S. provisional application No. 61/353,710, filed on Jun. 11, 2010 and entitled SYSTEM AND METHOD FOR GROUND ISOLATION DETECTION IN A VEHICLE, under 35 U.S.C. 119(e).

FIELD OF THE INVENTION

This invention relates to a system and method for ground isolation detection (e.g., ground or chassis reference) in a vehicle.

BACKGROUND OF THE INVENTION

Electric and hybrid vehicles may have one or more high voltage buses that are isolated from the chassis, Earth ground, or both, of the vehicle during normal operation. A hybrid vehicle may comprise an internal combustion engine that rotates a generator rotor or an alternator rotor to provide electrical energy for one or more electric drive motors to propel the vehicle. However, if an electrical short or another electrical problem occurs in vehicle circuitry or electromechanical devices on the vehicle, one or more high voltage buses may apply undesired electrical energy to the vehicle chassis, which can detract from vehicle performance or pose safety concerns. Thus, there is need to detect degraded electrical isolation between one or more high voltage buses and the chassis or Earth ground of the vehicle. Further, there is need to identify the source or location of the electrical problem on the vehicle.

SUMMARY OF THE INVENTION

In accordance with one embodiment of the invention, a system is arranged for detecting a ground fault or degraded isolation level (e.g., degraded from normal isolation level or impedance) between a bus terminal and ground on a vehicle, where ground or ground potential refers to Earth ground, chassis reference, or both. The system comprises a first bus terminal isolated from ground and chassis reference during normal operation of the vehicle. A second bus terminal is isolated from ground and chassis reference during normal operation of the vehicle. A first amplifier is arranged to receive a first signal (e.g., a first measurement signal) from the first bus terminal via an input of the first amplifier. A second amplifier is configured to receive a second signal (e.g., second measurement signal) from the second bus terminal via an input of the second amplifier. To accommodate a positive electrical potential between the bus terminal and ground (e.g., chassis reference), an inverter input of an inverter is coupled to an output of the first amplifier. An input or inputs of an analog-to-digital converter are coupled to an inverter output of the inverter and the output of the second amplifier. A data processor is capable of receiving an output of the analog-to-digital converter to produce a digital signal representative of the signals received from the first bus terminal and the second bus terminal. The data processor is configured to apply one or more frequency domain transforms (e.g., fast Fourier Transform) to the digital signal. The data processor identifies at least one of a circuit location of the ground fault (e.g., chassis reference fault) or degraded isolation, and a type of ground fault (e.g., chassis reference fault) or degraded isolation based on the application of the frequency domain transform to the digital signal.

DESCRIPTION OF THE PREFERRED EMBODIMENT

As used in this document, "ground" may refer to one or more of the following: (1) Earth ground, (2) chassis reference or chassis potential (e.g., vehicle chassis potential) of the vehicle chassis with respect to Earth ground or another reference point, or (3) Earth ground and chassis reference, where the chassis reference equals or is substantially equivalent to Earth ground and where substantially equivalent means plus or minus ten percent of any value or electrical parameter (e.g., voltage). As used in this document, isolation or ground isolation may refer to isolation between the vehicle bus or another observed circuit point and Earth ground, chassis reference, or both. As used in this document, ground fault may refer to a short circuit or low resistance or impedance between the vehicle bus or another observed circuit point and Earth ground, chassis reference, or both.

Figure 1:
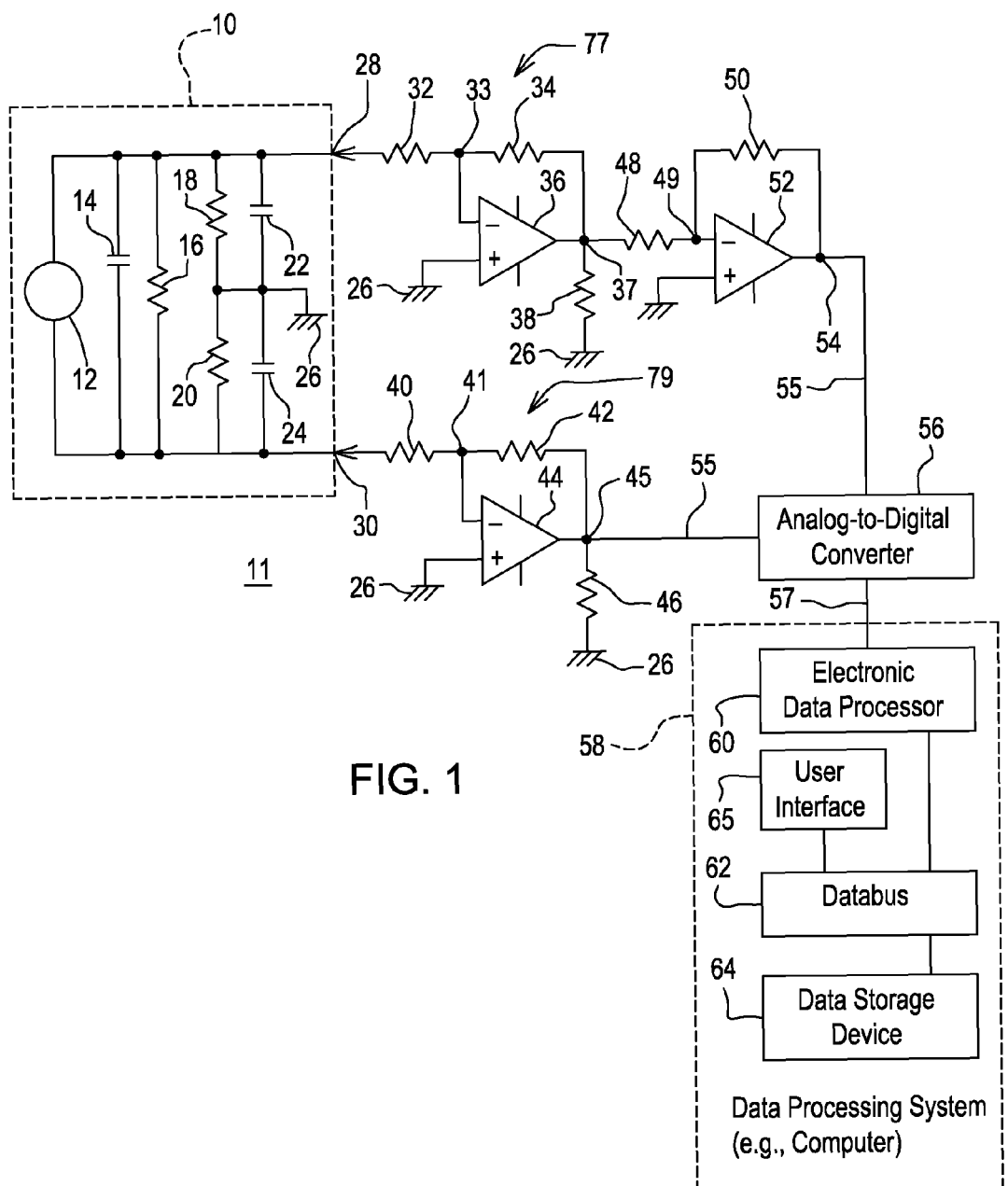
FIG. 1 is a schematic and block diagram of one embodiment of a system for ground isolation detection in a vehicle.

In accordance with one embodiment of the invention, FIG. 1 illustrates a system 11 for ground isolation detection. During operation, the system 11 is coupled to the first bus terminal 28 and a second bus terminal 30, which are associated with a vehicle bus assembly 10. In one embodiment, the vehicle bus assembly 10 may be configured as a differential voltage supply with two terminals of opposite polarity: a first bus terminal 28 and a second bus terminal 30. The vehicle bus assembly 10 may comprise a direct current voltage bus, an alternating current voltage bus, or hybrid bus with both direct current components and alternating current components. Each of the vehicle buses (28, 30) is generally considered a floating bus because neither the first bus terminal 28, nor the second bus terminal 30 is connected directly to ground or the chassis of the vehicle.

In FIG. 1, the vehicle bus assembly 10 is enclosed in dashed lines because the vehicle bus assembly 10 is what the system 11 for ground isolation detection is measuring and evaluating via the first bus terminal 28 and the second bus terminal 30. Further, the vehicle bus assembly 10 is shown in dashed lines because the resistors (16, 18, 20) and capacitors (14, 22, 24) inside the dashed lines are merely shown for purposes of modeling the electrical characteristics of the vehicle bus assembly 10 and do not represent discrete resistors or capacitors coupled to the first bus terminal 28 and a second bus terminal 30, but rather equivalent circuit representations as are known to those of ordinary skill in the electronics arts.

The vehicle bus assembly 10 may be modeled as an energy source 12 or voltage supply that has a capacitive load 14 and a resistive load 16 in parallel (collectively, the "load" or "electrical load") with the energy source 12. Although the capacitive load 14 is illustrated as a capacitor and the resistive load 16 is illustrated as a resistor in FIG. 1, the capacitor and resistor merely represent equivalent circuits for any electrical load, such as a drive motor, a battery, an energy storage device, an electric fuel pump, an electrical power steering pump, an electrical motor for an air-conditioning compressor, a window defroster, a heating coil, a radio, an on-board computer, an electronic device, or another electrical load. Further, although not shown in FIG. 1, it is possible that the load may have an inductive component, which could be in series with the resistive load 16, the capacitive load 14, or in parallel with the resistive load 16, the capacitive load 14, or both.

The system 11 for ground isolation detection comprises a first bus terminal 28 and a second bus terminal 30 isolated from ground potential during normal operation of the vehicle. The isolation may be defined as one or more of the following: capacitance, resistance, inductance, reactance, or conductivity, and any corresponding values of the foregoing electrical properties. For example, in the vehicle bus assembly 10 the isolation (e.g. normal isolation level) of the first bus terminal 28 from ground may be modeled as first capacitive isolation 22 and a first resistive isolation 18 between the first bus terminal 28 and ground 26, as shown in FIG. 1. The isolation (e.g., normal isolation level) of the second bus terminal 30 from ground may be modeled as a second capacitive isolation 24 and second resistive isolation 20 between the second bus terminal and ground 26, as shown in FIG. 1.

A first amplifier 36 is coupled to the first bus terminal 28 via a first input resistor 32. A second amplifier 44 is coupled to the second bus terminal 30 via a second input resistor 40. To accommodate a positive potential between the bus terminal and ground (e.g., chassis reference), an inverter input 49 is coupled, directly or indirectly, to the output 37 (e.g., output node) of the first amplifier 36. As illustrated in the example of FIG. 1, a third input resistor 48 is connected in series between the output 37 of the first amplifier 36 and the input of the inverter 52, although other impedance matching arrangements may be used. A first resistive network 77 is associated with the first amplifier 36, whereas a second resistive network 79 is associated with the second amplifier 44. One or more inputs 55 of an analog-to-digital converter 56 is coupled to the output 54 of the inverter 52 and the output 45 the second amplifier 44. An output 57 of the analog-to-digital converter 56 is coupled to an electronic data processing system 58 (or a computer) via a data port coupled to a data bus 62, a data processor 60 or otherwise. The data processing system 58 comprises an electronic data processor 60 (e.g. microprocessor) that is coupled to a data storage device 64 (e.g., electronic memory) via a data bus 62. Further, the data processing system 58 comprises a user interface 65 coupled to the data bus 62.

In one embodiment, the first amplifier 36 and the second amplifier 44 each comprise an operational amplifier.

In one configuration, the first resistive network 77 comprises a first input resistor 32, a second resistor 34, and third resistor 38. The first resistive network 77 may comprise a first resistive voltage divider for the first amplifier 36 to scale an input voltage to a suitable level for the first amplifier 36. The second resistor 34 (connected to the first amplifier 36) may comprise a feedback resistor (e.g., first feedback resistor) for adjusting the first gain of the first amplifier 36, for example. The second resistive network 79 comprises a second input resistor 32, a fourth resistor 42, and a fifth resistor 46. The second resistive network 79 may comprise a second resistive voltage divider for the second amplifier 44 to scale an input voltage to a suitable level for the second amplifier 44. The fourth resistor 42 (connected to the second amplifier 44) may comprise a feedback resistor (e.g., a second feedback resistor) for adjusting the second gain of the second amplifier 44, for example. The values of the first feedback resistor and the second feedback resistor may be selected to substantially equalize the first gain and the second gain of the first amplifier 36 and the second amplifier, respectively, where substantially equalize or substantially equal refers to a gain that is plus or minus approximately 1 decibel or a gain (e.g., common mode gain) that is approximately within ten (10) percent between the amplifiers (36, 44).

In one embodiment, the electronic data processor comprises a microprocessor, a microcontroller, a programmable logic array, an application specific integrated circuit, logic circuit, an arithmetic logic circuit, or another electronic device for inputting, processing, and outputting electronic data. In one configuration, the user interface 65 comprises one or more of the following: a keyboard, a keypad, a switch, a display, an electronic pointing device (e.g., mouse or trackball), or another device for supporting the viewing, inputting or outputting of electronic data to a user from the data processing system 56.

In an alternate embodiment, the user interface 65 comprises an on-board (e.g., on-vehicle) or off-board (e.g., off-vehicle) computer module which can receive, transmit or communicate data to or from the data processing system 56 via a vehicle data bus, conductor or other transmission line.

The data storage device 64 may comprise electronic memory, non-volatile random access memory, a disk-drive, a magnetic storage device, an optical storage device, or another device for reading, writing, or storing electronic data.

The first amplifier 36 is arranged to receive a first signal (e.g., first measurement signal or a series of measurement samples at regular or periodic intervals) from the first bus terminal 28 via the first input resistor 32 coupled in series between the first bus terminal 28 and an input 33 of the first amplifier 36. The second amplifier 44 is configured to receive a second signal (e.g., second measurement signal or a series of measurement samples at regular or periodic intervals) from the second bus terminal 30 via the second input resistor 40 coupled in series between the second bus terminal 30 and an input 41 of the second amplifier 44. An inverter input 49 of an inverter 52 receives and inverts the output signal of the first amplifier 36 such that the polarity of the first signal, derived from the first bus terminal 28, at the inverter 52 output 54 (or output node 54), is the same polarity as that of the second signal, derived from the second bus terminal 30, at the output 45 (or output node 45) of the second amplifier 44. The inverter 52 simplifies the design for the system 11 for isolation detection by avoiding the additional expense that would otherwise be required for a dual level voltage supply and multiple digital-to-analog converters to support measurement of opposite polarity signals at outputs 54 and 45, for example.

An input or inputs 55 of an analog-to-digital converter 56 convert the inputted analog signals, representative of the measurement values on the first vehicle bus 28 and the second vehicle bus 30, to outputs. A data processor 60 is coupled to an output 57 of the analog-to-digital converter 56. The analog-to-digital converter 57 provides or outputs a digital signal representative of the first signal and the second signal measured at the first data bus 28 and the second data bus 30, respectively.

The data processor 60 is configured to apply one or more frequency domain transforms to the digital signal, which may comprise a group of samples of measurements, taken over regular or periodic intervals, of the first bus terminal 28 and the second bus terminal 30. In one example, the frequency domain transform comprises a Fourier transform, a fast Fourier transform or another transform as explained later herein. The data processor 60 provides one or more of the following as output to a user via a user interface 65 coupled to the electronic data processing system 58: (1) a circuit location of a ground fault (e.g., in a direct current (DC) to DC converter or a DC to alternating current (AC) converter), (2) an identity of an electrical (e.g., wiring), electronic or electromechanical device (e.g., electric motor, generator, or alternator) causing a ground fault, (3) a circuit location of degraded isolation between the vehicle data bus and ground, (4) an identity of an electrical (e.g., wiring), electronic or electromechanical device (e.g., electric motor, generator, or alternator) causing degraded isolation between the vehicle data bus and ground, (5) a level of degraded or normal isolation, (6) a type of ground fault based on the application of the frequency domain transform to the digital signal (or group of measurements), (7) a dominant frequency component of the degraded isolation or ground fault, and (8) a magnitude of coefficients of the transform associated with the dominant frequency component of the degraded isolation or ground fault.

The data processor 60 is programmed to identify ground faults or changes in isolation between the chassis and one or more vehicle buses (28, 30) on the vehicle. The data processor 60 may operate in accordance with one or more of the following techniques that may be applied alternately or cumulatively.

Under a first technique, the data processor 60 identifies a wiring harness fault as the ground fault or degraded isolation where the data processor 60 determines that a ground fault occurred at a frequency of approximately zero or as a direct current short circuit. Under a second technique, the data processor 60 identifies a motor winding fault (e.g., of an electric drive motor of the vehicle) as the ground fault or degraded isolation where the data processor 60 determines that a ground fault occurred within a range of a switching frequency of an electrical motor. Under a third technique, the data processor 60 identifies a motor winding fault as the ground fault or degraded isolation where the data processor 60 determines that a ground fault occurred within the range of approximately one-thousand Hertz to approximately six thousand Hertz.

Under a fourth technique, data processor 60 distinguishes a ground fault associated with a wiring harness short with a ground fault or degraded isolation associated with a direct current motor short based upon application of at least one of a Fourier transform, a discrete time Fourier transform, a fast Fourier transform, a Z-transform, and a Laplace transform; as the frequency domain transform. Further, the data processor 60 may generate a diagnostic code associated with the distinguished ground fault or degraded isolation between a vehicle bus terminal (28, 30) and ground. The diagnostic code associated with the ground fault or isolation may be stored in data storage 64 or organized as data packets (e.g., formatted for wireless transmission or over Internet protocol) in the data storage 64.

Under a fifth technique, the data processor 60 distinguishes a ground fault or degraded isolation associated with an electrical leakage current or short circuit between a ground and the first bus terminal 28 and a ground fault associated with an electrical leakage current or short circuit between a ground and the second bus terminal 30. Further, the data processor 60 generates a diagnostic code associated with the distinguished ground fault or degraded isolation.

Under a sixth technique, the data processor 60 identifies a converter malfunction or fault of a DC-to-DC converter or a DC-to-AC converter as the ground fault or degraded isolation where the data processor 60 determines that a ground fault or degraded isolation occurred within the range of alternating current frequencies with a signature frequency. For example, the data processor 60 identifies a converter as the source of a ground fault or the degraded isolation where the data processor 60 determines that the ground fault or the degraded isolation occurred within a signature frequency range, indicative of alternating current present on at least one of the first bus terminal and the second bus terminal. In the sixth technique, alternating current may leak on the vehicle bus or DC bus such that an AC fault signature appears in the mathematical transformation (e.g., fast Fourier transform).

Figure 2:
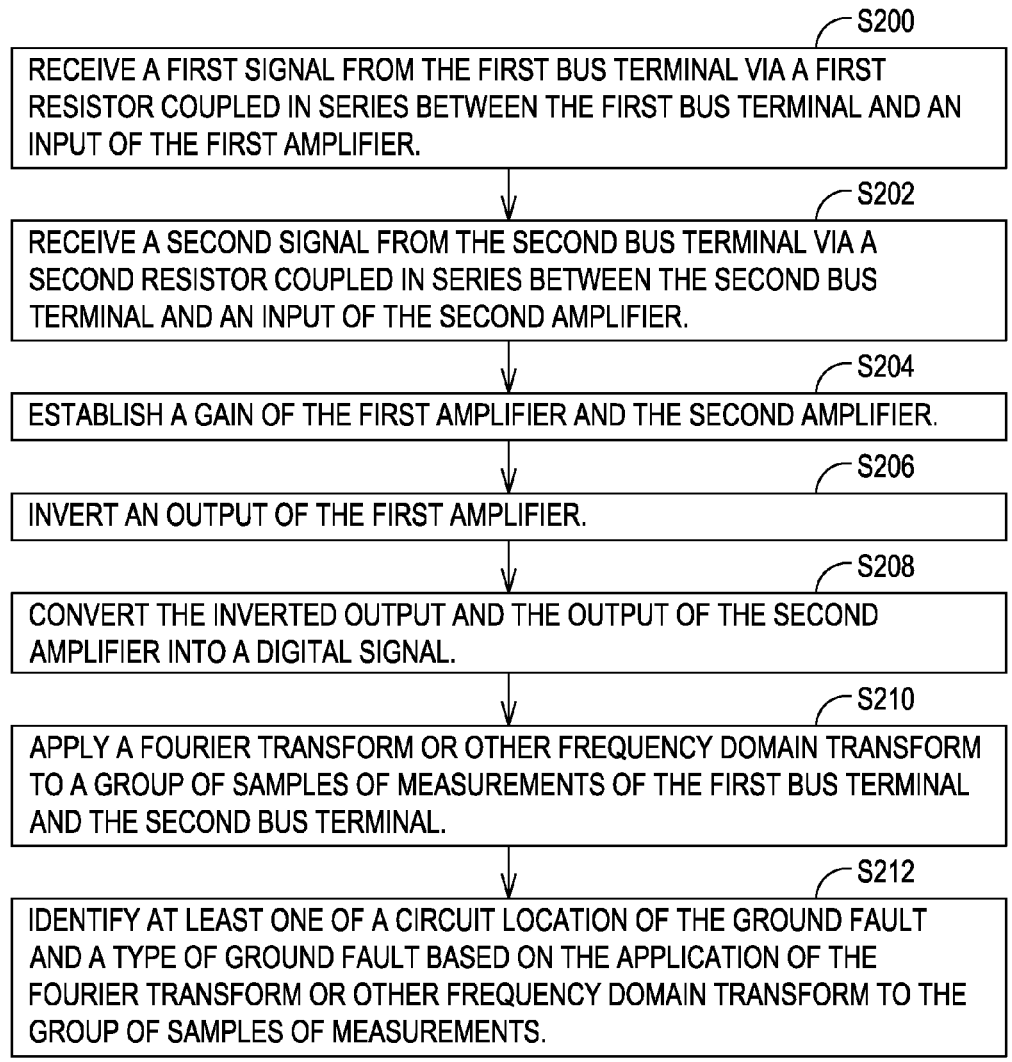
FIG. 2 is a flow chart of one example of a method for ground isolation detection in a vehicle.

FIG. 2 illustrates one example of a method for detecting a ground fault or degraded isolation between a first bus terminal 28 and ground, between a second bus terminal 30 and ground, or between both a first bus terminal 28 and a second bus terminal 30 and ground on a vehicle. The method of FIG. 2 begins in step S200 and is described, for illustrative purposes, in conjunction with the system 11 of FIG. 1.

In step S200, the first amplifier 36 receives a first signal (e.g., a first measurement signal) from the first bus terminal 28. For example, the first amplifier 36 receives a first signal (e.g., first measurement samples) at regular or periodic intervals at a sampling rate via the first input resistor 32 coupled in series between the first bus terminal 28 and an input of the first amplifier 36. In one configuration, the sampling rate is selected to be greater than the maximum motor frequency or maximum excitation frequency of an electric motor (e.g. alternating current electric motor that has its rotational speed controlled by frequency, waveform, pulse rate, or pulse width modulation of one or more electrical signals applied to the motor).

In step S202, the second amplifier 44 receives a second signal (e.g., a second measurement signal) from the second bus terminal 30. For example, the second amplifier 44 receives a second signal (e.g., second measurement samples) at regular or periodic intervals at a sampling rate via the second input resistor 40 coupled in series between the second bus terminal 30 and an input of the second amplifier 44. In one configuration, the sampling rate is selected to be greater than the maximum motor frequency or maximum excitation frequency of an electric motor (e.g. alternating current electric motor that has its rotational speed controlled by frequency, waveform, pulse rate, or pulse width modulation of one or more electrical signals applied to the motor).

In step S204, the first gain of the first amplifier 36 and the second gain of the second amplifier 44 are established. For example, the first gain of the first amplifier 36 is established by the selection of the value or resistance of the second resistor 34, whereas the second gain of the second amplifier 44 is established by the selection of the value or resistance of the fourth resistor 42. The resistance of the second resistor 34 and the fourth resistor 42 may be equal or different to compensate for manufacturing tolerances, design differences or other discrepancies between the first amplifier 36 and the second amplifier 44. For example, the value of the second resistor 34 may be reduced for the first amplifier 36, where the first amplifier 36 has a lower inherent gain than the second amplifier 44 such that the gain of both the first amplifier 36 and the second amplifier 44 are approximately equal to one another. Similarly, the value of the fourth resistor 42 may be reduced for the second amplifier 44, where the second amplifier 44 has a lower inherent gain than the first amplifier 36 such that the gain of both the first amplifier 36 and the second amplifier 44 are approximately equal to one another.

In step S206, the inverter 52 inverts an output of the first amplifier 36. In particular, the inverter 52 generally outputs the reverse polarity of its input signal with unity amplification or minimal change in the level (e.g., magnitude) of the output signal versus the input signal. Advantageously, the inverter minimizes or reduces the cost, weight and size of the system 11. The inverter 52 simplifies the design for the system 11 for isolation detection by avoiding the additional cost, weight and volume that would otherwise be required for a dual level voltage supply and multiple digital-to-analog converters to support measurement of opposite polarity signals at outputs 54 and 45, for example.

In step S208, the analog-to-digital converter 56 converts the inverted output and the output of the second amplifier 44 into a digital signal in preparation for subsequent processing. The digital signal may represent one or more samples of the signals measured from the first vehicle bus 28 and the second vehicle bus 30.

Although not shown in FIG. 2, after step S208 and prior to step S210, the digital signal from the analog-to-digital converter 56 may be filtered, decimated, or both by the data processing system 48 prior to applying the frequency domain transform in step S210. With respect to decimation, the decimation factor is used to determine which samples of the digital data, representative of the first and second signals from the vehicle bus terminals (28, 30), are removed from further evaluation by the data processor 60. For example, a decimation factor of two may remove every other sample from further consideration, whereas a decimation factor of ten may remove every tenth sample from further consideration by the data processor 60 or data processing system 48. With respect to filtering of the digital data, the digital signals or decimated data may filtered to remove a start up period (e.g., first second after motor starting-up) to eliminate transients as the motor reaches its operational rotational velocity.

In step S210, the data processor 60 or data processing system 58 applies one or more frequency domain transforms to a group of samples of measurements of the first bus terminal 28 and the second bus terminal 30. For example, the data processor 60 or data processing system 58 applies a fast Fourier transform to the decimated samples, the filtered samples, the digital data outputted from the analog-to-digital converter 57, or a derivative of the digital data outputted from the analog-to-digital converter 57. The data processor 60 or data processing system 58 may express the result of the frequency domain transform as one or more Fast Fourier transform vectors, where each vector has a magnitude, a corresponding frequency, and a corresponding phase. In one embodiment, the phase of the Fast Fourier transform vector may be ignored. The magnitude of the vector(s) is associated with the sum of the alternating current components, the direct current components, or both. The magnitude of a vector for a respective frequency range or bin is referred to as a magnitude coefficient.

In step S212, the data processor 60 or the data processing system identifies a circuit component identity or circuit location of the ground fault or degraded isolation, or a type of ground fault or degraded isolation based on the application of the frequency domain transform to digital data (e.g., a group of samples of measurements collected from the vehicle buses 28, 30). For example, to carry out step S212, the data processor 60 or the data processing system 58 may compare the result of a frequency domain transform (e.g., a fast Fourier Transform) to a reference failure profile. The data processing system 58 or data processor 60 is capable of organizing the results or frequency transformed data into distinct frequency bins or windows, and assigns a corresponding magnitude or coefficient for each frequency bin to form an observed profile. A circuit component (e.g., an electrical device, electromechanical device, or electronic device of the vehicle) may have a reference profile (e.g., reference failure profile, reference pattern or reference signature) stored in the data storage device 64 and associated with a reference magnitude coefficient for one or more corresponding reference frequency bins. The reference profile may be stored as a look-up table, a file, an inverted file, a data record, or a database, for example. If the result of the observed profile (e.g., observed frequency domain transform) substantially matches a reference profile, the data processor 60 may generate a respective diagnostic code or data message, indicative of a circuit component identity or circuit location of the ground fault or degraded isolation, or a type of ground fault or degraded isolation, for the user interface 65 or for storage in the data storage device 64 for later retrieval or transmission.

The data processor 60 is programmed or instructed to identify ground faults or changes in isolation between the chassis and one or more voltage buses on the vehicle. The data processor 60 or data processing system may operate in accordance with one or more of the following techniques, which may be applied alternately or cumulatively.

Under a first technique, the data processor 60 or data processing system 58 identifies a wiring harness fault as the ground fault or degraded isolation where the data processor 60 determines that a ground fault or degraded isolation occurred at a frequency of approximately zero or as a direct current short circuit. Under a second technique, the data processor 60 or data processing system 58 identifies a motor winding fault as the ground fault or degraded isolation where the data processor 60 determines that a ground fault occurred within a range of a switching frequency of an electrical motor. Under a third technique, the data processor 60 or data processing system 58 identifies a motor winding fault as the ground fault or degraded isolation where the data processor 60 determines that a ground fault or degraded isolation occurred within the range of approximately one-thousand Hertz to approximately six thousand Hertz.

Under a fourth technique, data processor 60 or data processing system 58 distinguishes a ground fault or degraded isolation associated with a wiring harness short with a ground fault associated with a direct current motor short based upon application of at least one of a Fourier transform, a discrete time Fourier transform, a fast Fourier transform, a Z-transform, and a Laplace transform; as the frequency domain transform. Further, the data processor 60 or data processing system 58 generates a diagnostic code associated with the distinguished ground fault.

Under a fifth technique, the data processor 60 or data processing system 58 distinguishes a ground fault associated with an electrical leakage current or short circuit between a ground and the first bus terminal 28 and a ground fault associated with an electrical leakage current or short circuit between a ground and the second bus terminal 30. Further, the data processor 60 or data processing system 58 generates a diagnostic code associated with the distinguished ground fault.

Under a sixth technique, the data processor 60 identifies a converter fault of a DC to DC converter or a DC to AC converter as the ground fault or degraded isolation where the data processor 60 determines that a ground fault or degraded isolation occurred within the range of alternating current frequencies with a signature frequency. In the sixth technique, alternating current may leak on the vehicle bus or DC bus such that an AC fault signature appears in the mathematical transformation (e.g., fast Fourier transform).

Figure 3:
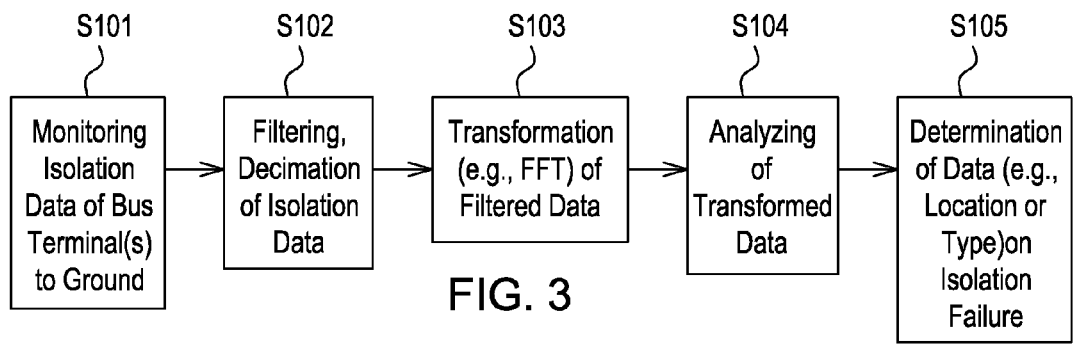
FIG. 3 is a flow chart of another example of a method for ground isolation detection in a vehicle.

FIG. 3 illustrates one example of a method for detecting a ground fault between a first bus terminal 28, a second bus terminal 30, or both and ground on a vehicle. The method of FIG. 3 begins in step S101 and is described, for illustrative purposes, in conjunction with the system 11 of FIG. 1.

In step S101, the data processing system 58 monitors isolation data of the first bus terminal 28 and the second bus terminal 30 in accordance with the system 11 of FIG. 1 or otherwise. For example, step S101 may be executed by application of steps S200, S202, S204, S206, and S208 of FIG. 2, or otherwise.

In step S102, the data processing system 58 or data processor 60 applies a decimator or decimating filter to the oversampled data or digital data from the analog-to-digital converter 56 and applies a low-pass filter to reduce noise in the collected data.

In step S103, the data processing system 58 or data processor 60 applies a frequency domain transform, such as the fast Fourier transform to the filtered data, or another frequency domain mathematical transform, previously mentioned in this document.

In Step S104, the data processing system 58, data processor 60 or analyzer of the data processing system 58 analyzes the frequency transformed data or the result of the frequency domain transform. For example, the data processing system 58 organizes the frequency transformed data into distinct frequency bins or windows, and assigns a corresponding magnitude or coefficient for each frequency bin to form an observed profile.

In Step S105, the data processing system 58 or data processor 60 determines the isolation of fault data for a potential or actual detected fault or isolation problem. The bin data and magnitude data can be compared against reference patterns of bin and magnitude data. If there is match between the observed pattern (e.g., observed bin and magnitude data) and the reference pattern, the fault data, isolation data, or other details may be used to identify the circuit component identity, the type and the location of the electrical short circuit, fault, or isolation problem.

Figure 4A:
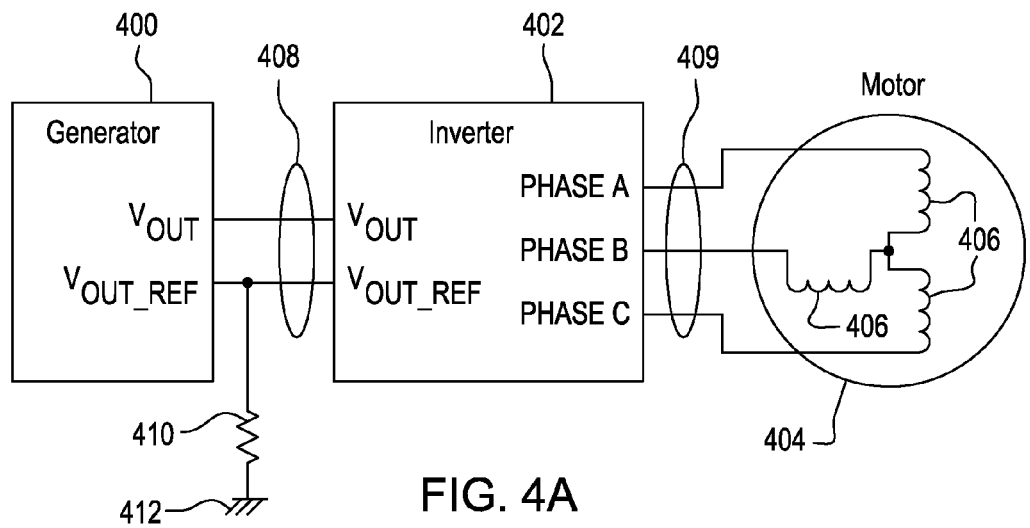
FIG. 4A is a schematic representation of an illustrative example of detection or identification of a wire harness fault in accordance with the system and method for ground isolation detection.

FIG. 4A illustrates a block diagram associated with a resistive fault or degraded isolation between one vehicle bus terminal 408 and ground 412. FIG. 4A illustrates a generator 400 coupled to an inverter 402 via two vehicle bus terminals 408. In turn, the inverter 52 is coupled to a motor 404 (e.g., an alternating current motor) comprising motor windings 406. The generator 400 may comprise a generator 400 that receives mechanical energy from a rotating shaft of an internal combustion engine (not shown). The generator 400 may convert the rotational mechanical energy into electrical energy (e.g., direct current electrical energy). The inverter 52 receives the electrical energy which may comprise direct current voltage and may convert the direct current voltage into alternating current, multiple phase alternating current (e.g. three phase current), pulse width modulation, or another waveform suitable for controlling the electric motor 404. For instance, the inverter 52 may control the directional rotation of the shaft of the electrical motor 404, the rotational speed of the shaft and available torque applied to the shaft of the electrical motor 404.

In the illustrative vehicle electrical configuration of FIG. 4 A. there is the potential for current leakage or degraded isolation between ground 412 and one of the vehicle bus terminals (408), as indicated by resistor 410, labeled $R_{Fault}$, connected between ground 412 and one the vehicle bus terminal 408. Here, the ground fault or degraded isolation has occurred in the wiring between the generator 400 and the inverter 402 of the vehicle, for example. The system 11 of FIG. 1 and the corresponding method for FIG. 2 may be applied to FIG. 4A by coupling the input 33 of the first amplifier 36 and the input 41 of the second amplifier 41 to the vehicle bus terminals 408, for example.

Figure 4B:
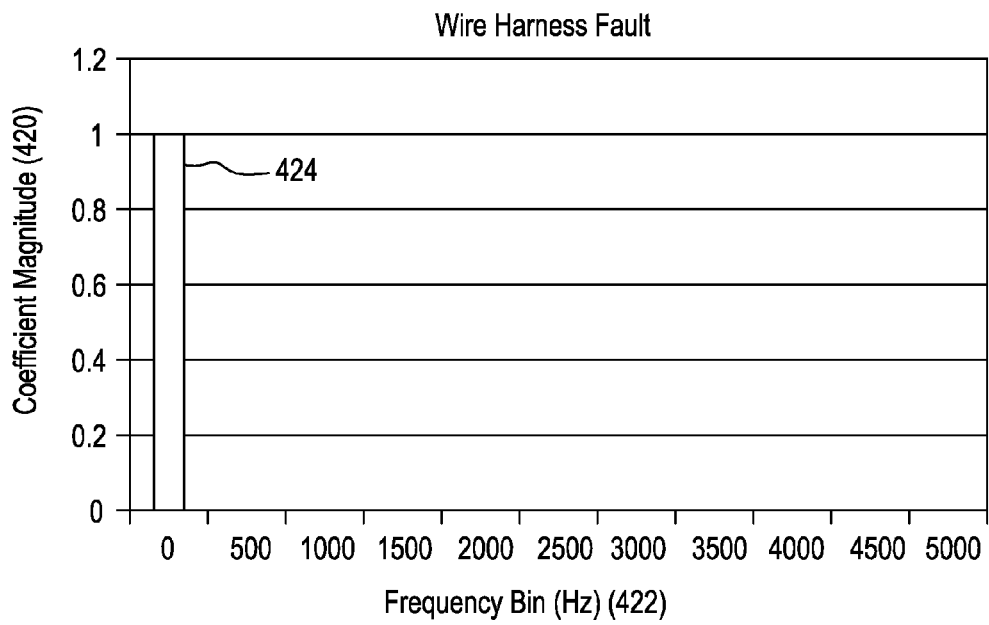
FIG. 4B is a chart illustrating the coefficient magnitude versus frequency bin for the wire harness fault in accordance with FIG. 4A.

FIG. 4B shows the results or observed pattern of the frequency domain transform or the Fast Fourier transform for the corresponding wiring harness fault of FIG. 4A. The vertical axis 420 in FIG. 4B is associated with the coefficient magnitude of the frequency domain transform, whereas the horizontal axis 422 is associated with the frequency (or discrete frequency bins or ranges). The data processing system 58 or data processor 54 evaluates the observed pattern to one or more reference patterns stored in the data storage device 64 or otherwise, to determine whether there is match between the observed pattern and the reference pattern as previously described in this document in conjunction with FIG. 2, for instance. The fault of FIG. 4A is readily identified as a wiring harness fault by the matching of the patterns or by observation (e.g., rules-based comparison) of the results of the frequency domain transform by the data processor 60 because: (a) it is on the direct current side of the vehicle circuitry and lies within the zero to five hundred Hertz (0-500 Hz) frequency bin, and (b) the coefficient of magnitude indicates that it is commensurate with a wiring harness fault at high voltage level, such as a single or asymmetrical fault on one vehicle bus terminal (408) between the generator and the inverter 402. If there were a fault between both vehicle bus terminals (408) between the generator 400 and inverter 402, the magnitude of the fault would be proportionally greater and possibly double that shown in FIG. 4B, for example.

Figure 5A:
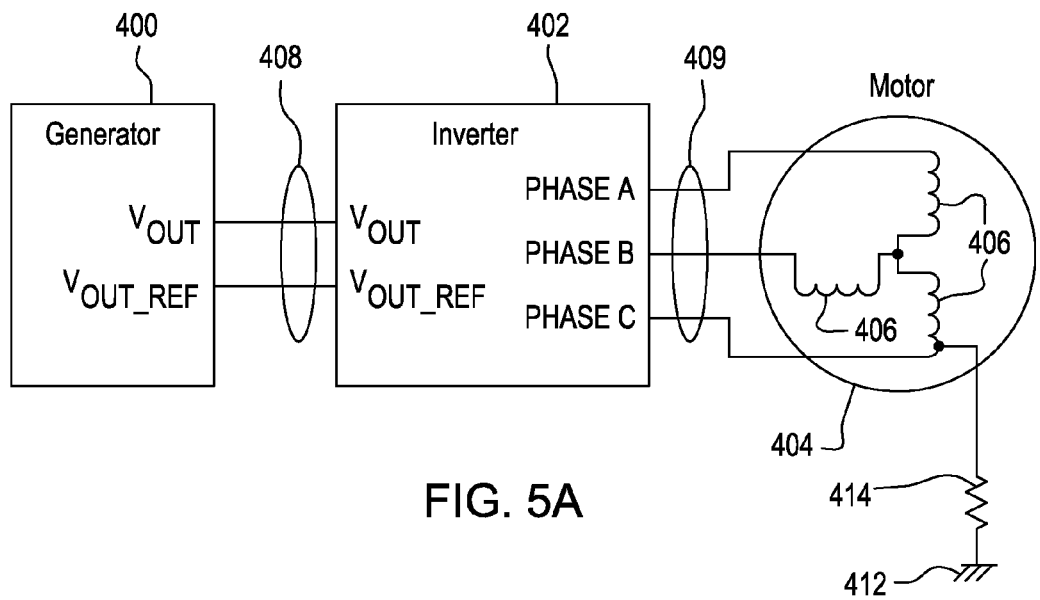
FIG. 5A is a schematic representation of an illustrative example of detection or identification of a motor winding fault in accordance with the system and method for ground isolation detection.

FIG. 5A shows substantially the same vehicle electrical configuration as FIG. 4A, except the leakage resistance 414, labeled resistor $R_{Fault}$, is not present between the vehicle terminal bus 408 and ground 412, where the vehicle terminal bus 408 (or voltage bus) is coupled between the generator 400 and the inverter 402. Instead, the leakage resistance 414 is between a motor winding 406 (e.g., one phase of a three-phase alternating current motor) and ground 414. Like reference numbers in FIG. 4A and FIG. 5A indicate like elements. The system 11 of FIG. 1 and the corresponding method for FIG. 2 may be applied to FIG. 5A by coupling the input 33 of the first amplifier 36 and the input 41 of the second amplifier 41 to the vehicle bus terminals 408, for example.

Figure 5B:
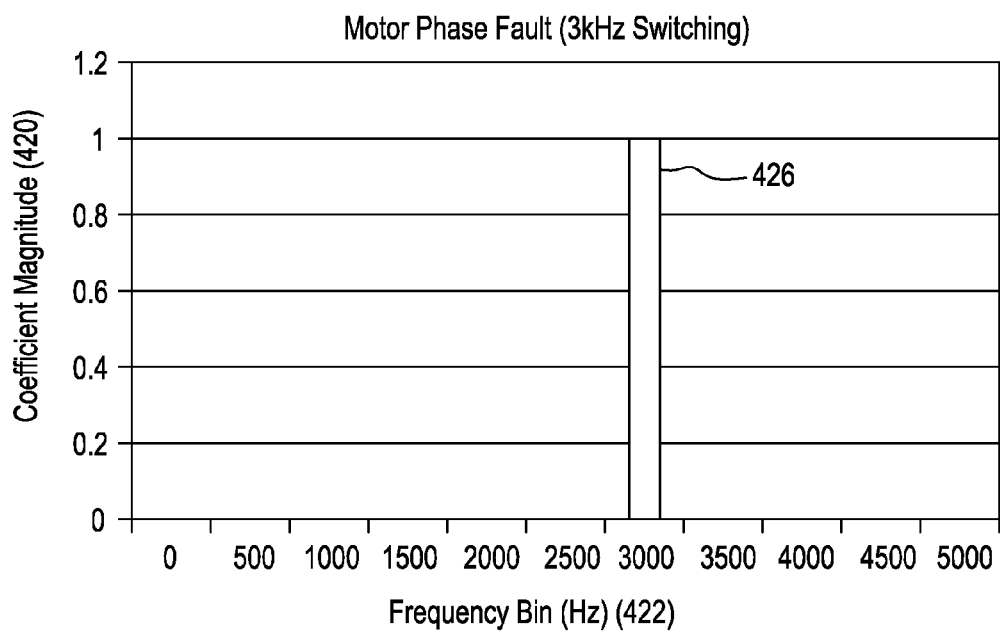
FIG. 5B is a chart illustrating the coefficient magnitude versus frequency bin for the motor winding fault in accordance with FIG. 5A.

FIG. 5B shows the results of the frequency domain transform or the Fast Fourier transform for the corresponding motor winding fault of FIG. 5A. The vertical axis 420 in FIG. 5B is associated with the coefficient magnitude of the frequency domain transform, whereas the horizontal axis 422 is associated with the frequency (or discrete frequency bins or ranges). The data processing system 58 or data processor 54 evaluates the observed pattern to one or more reference patterns stored in the data storage device 64 or otherwise, to determine whether there is match between the observed pattern and the reference pattern as previously described in this document in conjunction with FIG. 2, for instance. The fault or degraded isolation in FIG. 5B is readily identified as a motor winding fault (consistent with FIG. 5A) by the matching of the patterns or by observation (e.g., rules-based comparison) of the results of the frequency domain transform by the data processor 60 because: (a) it is on the alternating current side of the vehicle circuitry and lies within the two-thousand five hundred to three thousand Hertz (2500-3000 Hz) bin; (b) the frequency bin is commensurate with the frequency of switching in the inverter 402, as opposed to other alternating current devices coupled to the voltage buses 408; and (c) the coefficient of magnitude indicates that it is commensurate with a motor winding fault in at least one phase of the winding of the motor 404. For example, the coefficient may increase if additional windings or phases of the motor 404 were associated with degraded isolation to ground and/or the peak frequency bin may shift upward in the observed profile.

Having described the preferred embodiment, it will become apparent that various modifications can be made without departing from the scope of the invention as defined in the accompanying claims.

The following is claimed:

1. A system for detecting a ground fault or degraded isolation between a bus terminal and ground or a chassis reference on a vehicle, the system comprising:
   a first bus terminal isolated from ground and the chassis reference during normal operation of the vehicle;
   a second bus terminal isolated from ground and the chassis reference during normal operation of the vehicle;
   a first amplifier for receiving a first signal from the first bus terminal;
   a second amplifier for receiving a second signal from the second bus terminal;
   an inverter input of an inverter coupled to an output of the first amplifier;
   an analog-to-digital converter input of an analog-to-digital converter coupled to an inverter output of the inverter and an output of the second amplifier; and
   a data processor capable of receiving outputted digital data of the analog-to-digital converter, the data processor configured to apply a frequency domain transform to the digital data of the first bus terminal and the second bus terminal; the data processor identifying at least one of a circuit location of the ground fault or degraded isolation and a type of ground fault or degraded isolation based on the application of the frequency domain transform to the digital data.

2. The system according to claim 1 wherein the data processor identifies a wiring harness fault as the ground fault where the data processor determines that the ground fault or the degraded isolation occurred at a frequency of approximately zero or as a direct-current short circuit.

3. The system according to claim 1 wherein the data processor identifies a motor winding fault as the ground fault where the data processor determines that the ground fault or the degraded isolation occurred within a range of a switching frequency of an electrical motor.

4. The system according to claim 1 wherein the data processor identifies a motor winding fault as the ground fault or the degraded isolation where the data processor determines that a ground fault or the degraded isolation occurred within the range of approximately one-thousand Hertz to approximately six thousand Hertz.

5. The system according to claim 1 wherein the first amplifier and the second amplifier each comprise an operational amplifier.

6. The system according to claim 1 further comprising:
   a first input resistor coupled between the first bus terminal and an input of the first amplifier;
   a second input resistor coupled between the second bus terminal and an input of the second amplifier;
   a first feedback resistor connected between the input of the first amplifier and its output to adjust a first gain for the first amplifier; and
   a second feedback resistor connected between the input of the second amplifier and its output to adjust a second gain for the second amplifier, such that the first gain and the second gain are substantially equal.

7. The system according to claim 1 wherein the frequency domain transform comprises a fast Fourier transform.

8. The system according to claim 1 further comprising:
   the data processor distinguishes a ground fault or degraded isolation associated with a wiring harness short with a ground fault or degraded isolation associated with a direct-current motor short based upon application of at least one of a Fourier transform, a discrete time Fourier transform, a fast Fourier transform, a Z-transform, and a Laplace transform; as the frequency domain transform
   the data processor is arranged to generate a diagnostic code associated with the distinguished ground fault or the degraded isolation.

9. The system according to claim 1 further comprising:
   the data processor distinguishes a ground fault or degraded isolation associated with an electrical leakage current or short circuit between a ground or a chassis reference and the first bus terminal and a ground fault associated with an electrical leakage current or short circuit between a ground or a chassis reference and the second bus terminal;
   the data processor is arranged generates a diagnostic code associated with the distinguished ground fault or the degraded isolation.

10. The system according to claim 1 further comprising:
    a data storage device;
    a reference profile stored in the data storage device;
    the data processor comparing an observed profile, formed by the application or results of the frequency domain transform to the digital data, to determine if the observed profile matches the reference profile; and
    the data processor generating a diagnostic code or other data message associated with the particular degraded isolation or particular ground fault associated with the reference profile for a match between the observed profile and the reference profile.

11. The system according to claim 1 wherein the data processor identifies a converter as the ground fault or the degraded isolation where the data processor determines that the ground fault occurred within a signature frequency range, indicative of alternating current present on at least one of the first bus terminal and the second bus terminal.

12. A method for detecting a ground fault between a first bus terminal, a second bus terminal and ground or chassis reference on a vehicle, the method comprising:
    receiving a first signal from the first bus terminal via an input of the first amplifier;
    receiving a second signal from the second bus terminal via an input of the second amplifier;
    establishing a gain of the first amplifier and the second amplifier;
    inverting an output of the first amplifier;
    converting the inverted output and the output of the second amplifier into a digital signal;
    applying a frequency domain transform to the digital signal, representative of the first and second signals received on the first bus terminal and the second bus terminal; and
    identifying, by a data processor, at least one of a circuit location of the ground fault or degraded isolation, and a type of ground fault or degraded isolation based on the application of the frequency domain transform to the group of samples of measurements.

13. The method according to claim 12 where the identifying further comprises:
identifying a wiring harness fault as the ground fault or the degraded isolation where the data processor determines that the ground fault or the degraded isolation occurred at a frequency of approximately zero or as a direct current short circuit.

14. The method according to claim 12 where the identifying further comprises:
identifying a motor winding fault as the ground fault or the degraded isolation where the data processor determines that a ground fault or the degraded isolation occurred within a range of a switching frequency of an electrical motor.

15. The method according to claim 12 where the identifying further comprises:
identifying a motor winding fault as the ground fault or the degraded isolation where the data processor determines that the ground fault or the degraded isolation occurred within the range of approximately one-thousand Hertz to approximately six thousand Hertz.

16. The method according to claim 12 wherein the frequency domain transform comprises a fast Fourier transform.

17. The method according to claim 12 further comprising:
distinguishing a ground fault or degraded isolation associated with a wiring harness short with a ground fault associated with a direct current motor short based upon application of at least one of a Fourier transform, a discrete time Fourier transform, a fast Fourier transform, a Z-transform, and a Laplace transform; as the frequency domain transform; and
generating a diagnostic code associated with the distinguished ground fault or the degraded isolation.

18. The method according to claim 12 further comprising:
distinguishing a ground fault or degraded isolation associated with an electrical leakage current or short circuit between a ground and the first bus terminal and a ground fault associated with an electrical leakage current or short circuit between a ground and the second bus terminal; and
generating a diagnostic code associated with the distinguished ground fault or the degraded isolation based on a reference profile stored in the data storage device;
the data processor comparing an observed profile, formed by the application or results of the frequency domain transform to the digital data, to determine if the observed profile matches the reference profile;
the data processor generating a diagnostic code or other data message associated with the particular degraded isolation or particular ground fault associated with the reference profile for a match between the observed profile and the reference profile.

19. The method according to claim 12 further comprising:
equalizing the first gain of the first amplifier and the second gain of the second amplifier by selecting values of a first feedback resistor associated with the first amplifier and a second feedback resistor associated with the second amplifier.

20. The method of claim 12 further comprising:
storing a reference profile in a data storage device capable of communication with the data processor;
comparing an observed profile, formed by the application or results of the frequency domain transform to the digital data, to determine if the observed profile matches the reference profile; and
generating a diagnostic code or other data message associated with the particular degraded isolation or particular ground fault associated with the reference profile for a match between the observed profile and the reference profile.

21. The method according to claim 12 wherein the identifying further comprises:
identifying a converter as the ground fault or the degraded isolation where the data processor determines that the ground fault occurred within a signature frequency range, indicative of alternating current present on at least one of the first bus terminal and the second bus terminal.

* * * * *